United States Patent [19]

Weinstein

[11] Patent Number: 6,083,885
[45] Date of Patent: Jul. 4, 2000

[54] METHOD OF FORMING TEXTURED HIGH-TEMPERATURE SUPERCONDUCTORS

[76] Inventor: Roy Weinstein, 4368 Fiesta La., Houston, Tex. 77004

[21] Appl. No.: 09/006,561

[22] Filed: Jan. 13, 1998

Related U.S. Application Data

[60] Provisional application No. 60/035,016, Jan. 14, 1997.

[51] Int. Cl.[7] .................................................. H01L 39/24
[52] U.S. Cl. ........................ 505/320; 505/325; 505/785; 427/62
[58] Field of Search ................................. 505/320, 785, 505/325; 427/62

[56] References Cited

U.S. PATENT DOCUMENTS

| | | | |
|---|---|---|---|
| 4,996,192 | 2/1991 | Fleischer | 505/1 |
| 5,034,373 | 7/1991 | Smith et al. | 505/432 |
| 5,087,606 | 2/1992 | Fleischer et al. | 505/1 |
| 5,116,810 | 5/1992 | Joshi et al. | 505/500 |
| 5,231,074 | 7/1993 | Cima et al. | 505/1 |
| 5,292,716 | 3/1994 | Sakai et al. | 505/1 |
| 5,321,003 | 6/1994 | Joshi et al. | 505/220 |
| 5,455,223 | 10/1995 | Rupich et al. | 505/100 |
| 5,472,527 | 12/1995 | Otto et al. | 505/431 |
| 5,525,583 | 6/1996 | Aized et al. | 505/211 |
| 5,531,015 | 7/1996 | Manlief et al. | 29/599 |
| 5,541,154 | 7/1996 | Neubacher et al. | 505/450 |
| 5,581,220 | 12/1996 | Rodenbush et al. | 335/216 |
| 5,602,080 | 2/1997 | Bednorz et al. | 505/451 |
| 5,604,473 | 2/1997 | Rodenbush | 335/216 |
| 5,635,456 | 6/1997 | Riley, Jr. et al. | 505/501 |
| 5,646,097 | 7/1997 | Tkaczyk et al. | 505/470 |
| 5,652,199 | 7/1997 | Isawa et al. | 505/441 |
| 5,659,277 | 8/1997 | Joshi et al. | 335/216 |
| 5,660,541 | 8/1997 | Woolf et al. | 432/8 |
| 5,661,114 | 8/1997 | Otto et al. | 505/501 |
| 5,665,682 | 9/1997 | Okamura et al. | 505/446 |
| 5,670,459 | 9/1997 | Sato et al. | 505/230 |
| 5,683,969 | 11/1997 | Masur et al. | 505/431 |
| 5,696,057 | 12/1997 | McArdle | 505/1 |
| 5,705,457 | 1/1998 | Tamura et al. | 505/482 |
| 5,849,667 | 12/1998 | Murakami et al. | 505/1 |
| 5,872,081 | 2/1999 | Woolf | 505/1 |

OTHER PUBLICATIONS

Schwartz et al, J. Appl. Phys. 73(3) pp. 1343–1347 Feb. 1993.

R. Weinstein, "Nuclear Engineering Fundamentals—Book II: Nuclear Physics", 1964, 97 pages, McGraw–Hill Book Co., New York.

Fleischer et al., "Increased Flux Pinning Upon Thermal–Neutron Irradiation of Uranium–Doped $YBaCu_3O_7$" Apr. 1989, 18 pages, General Electric Technical Report #89CRD047.

Fleischer et al., "Increased Flux Pinning upon Thermal–Neutron Irradiation of Uranium Doped $YBa_2Cu_3O_7$" Aug. 1989, pp. 2163–2169, Phys. Rev. B. vol. 40.

Van Dover et al., "Critical Currents Near $10^6 A/cm^2$ in Neutron–Irradiated Single–Crystal $YBa_2Cu_3O_7$" Nov. 1989, pp. 55–57, Nature, vol. 342.

Lubrosky et al., "Critical Currents after Thermal Neutron Irardiation of Uranium Doped Superconductors" Jan. 1991, pp. 28–35, J. Mater. Res., vol. 6.

Civali et al., "Vortex Confinement by Columnar Defects in $Yba_2Cu_3O_7$ Crystals: Enhanced Pinning at High Fields and Temperatures", 1991, p. 648, Phys. Rev. Lett., vol. 67.

Weinstein et al., "Materials, Characterization and Applications for High $T_c$ Superconducting Permanent Magnets", 1993, pp. 1145–1155, Applied Superconductivity, vol. 1, Pergamon Press.

Safar et al., "Enhancement of Transport Critical Current Densities at 75 K in $(Bi,Pb)_2Sr_2Ca_2Cu_2O_y$/Ag Tapes by Means of Fission Tracks from Irradiation by 0.8 GeV protons", Jul. 1995, pp. 130–132, Applied Physics Letters, vol. 67, No. 1.

Jammy et al., "Processing and Properties of AgClad BSCCO Superconductors", Houston 1996, Proc. of 10th Anniversary HTS Workshop, Ed. by B. Batlogg et al., World Scientific Press.

*Primary Examiner*—Roy V. King
*Attorney, Agent, or Firm*—D. Arlow Groves

[57] ABSTRACT

An oxide superconductor includes a textured superconducting material including an array of defects with a neutron-fissionable element, or with at least one of the following chemical elements: uranium-238, Nd, Mn, Re, Th, Sm, V, and Ta. The array of defects is dispersed throughout the superconducting material. The superconducting material may be the $RE_1Ba_2Cu_3O_{7-\delta}$ compound, wherein RE=Y, Nd, La, Sm, Eu, Gd, Dy, Ho, Er, Tm, Yb, Lu; the $Bi_2Sr_2CaCu_2O_x$, the $(Bi, Pb)_2Sr_2CaCu_2O_x$, $Bi_2Sr_2Ca_2Cu_3O_x$ or $(Bi, Pb)_2Sr_2Ca_2Cu_3O_x$ compound; the $Tl_2Ca_{1.5}BaCu_2O_x$ or $Tl_2Ca_2Ba_2Cu_3O_x$ compound; or a compound involving substitution such as the $Nd_{1+x}Ba_{2-x}Cu_3O_x$ compounds. The neutron-fissionable element may be uranium-235. The oxide superconductor may include additional defects created by fission.

20 Claims, 10 Drawing Sheets

FIG. 10A ced in the early 1900s. A superconducting material conducts current with zero energy loss and expels magnetic field (like a perfect diamagnetic material) when cooled below the transition temperature. Until the mid 1980s, all known superconducting materials were metallic compounds such as mercury (Hg), lead (Pb), and niobium-tin ($Nb_3Sn$). In general, these materials become superconducting at temperatures below 40 degrees Kelvin, depending on the material, by undergoing a transition from to the normal, resistive state to the superconducting state. The transition temperature ($T_c$) is a material specific temperature. For any material in the superconducting state at a given temperature and applied magnetic field, there is a maximum current density that the material is able to conduct without developing resistance. The critical current density ($J_C$) is also one of the factors that limits the maximum magnetic field H, at which a superconductor can remain in the superconducting state. As the externally applied magnetic field (H) increases, the critical current density $J_C(T, H)$ decreases. Above some critical field, $H_c$, the material can not support any current in the superconducting state and undergoes transition to the normal state. Both $H_c(T)$ and $J_C(T)$ increase when decreasing the cooling temperature of the superconductor.

METHOD OF FORMING TEXTURED HIGH-TEMPERATURE SUPERCONDUCTORS

This application claims priority from U.S. provisional patent application 60/035,016 filed Jan. 14, 1997.

FIELD OF THE INVENTION

The present invention relates to superconducting materials, and more specifically, to textured superconducting materials with high critical temperature and high critical current density.

BACKGROUND

The phenomenon of superconductivity was first discovered in the early 1900s. A superconducting material conducts current with zero energy loss and expels magnetic field (like a perfect diamagnetic material) when cooled below the transition temperature. Until the mid 1980s, all known superconducting materials were metallic compounds such as mercury (Hg), lead (Pb), and niobium-tin ($Nb_3Sn$). In general, these materials become superconducting at temperatures below 40 degrees Kelvin, depending on the material, by undergoing a transition from to the normal, resistive state to the superconducting state. The transition temperature ($T_c$) is a material specific temperature. For any material in the superconducting state at a given temperature and applied magnetic field, there is a maximum current density that the material is able to conduct without developing resistance. The critical current density ($J_C$) is also one of the factors that limits the maximum magnetic field H, at which a superconductor can remain in the superconducting state. As the externally applied magnetic field (H) increases, the critical current density $J_C(T, H)$ decreases. Above some critical field, $H_c$, the material can not support any current in the superconducting state and undergoes transition to the normal state. Both $H_c(T)$ and $J_C(T)$ increase when decreasing the cooling temperature of the superconductor.

Depending on certain magnetization properties, a superconducting material can be characterized as a type I superconductor or a type II superconductor. When increasing the applied current or magnetic field, or raising the temperature above $T_C$, type I superconductors undergo a direct transition from the perfectly diamagnetic state (i.e., the Meissner state) to the normal state. Type II superconductors, however, first develop a "mixed (vortex) state," wherein the applied magnetic field penetrates the superconducting material above the lower critical field ($H_{c1}$), and then the material undergoes the transition to the normal state above the upper critical field ($H_{c2}$). When the magnetic filed is raised above $H_{c1}$, it becomes energetically more favorable to admit into the material individual flux quanta in vortices than to maintain the Meissner state with the total flux exclusion. The vortices are distributed over the superconducting material to achieve an energetic minimum. When a transport current passes through the superconductor in the mixed state, the Lorentz force acts on the vortices. At the same time, chemical and physical defects in the superconducting material may keep the vortices "pinned" at the location of the defect. If the Lorentz force (which is proportional to the current density) exceeds the pinning forces, the vortices start to move and dissipate heat, which leads to resistivity.

In the mid 1980s, first high temperature superconductors (HTS) based on oxides of copper compounds were discovered. Some of these materials displayed superconductivity above liquid nitrogen temperature ($T_c$ >77 K) allowing dramatically more practical and economical cooling. For example, the HTS materials are compounds of $RE_1Ba_2Cu_3O_{7-\delta}$ wherein RE=Y, Nd, La, Sm, Eu, Gd, Dy, Ho, Er, Tm, Yb, Lu; the $Bi_2Sr_2CaCu_2O_x$, $(Bi, Pb)_2Sr_2CaCu_2O_x$, $Bi_2Sr_2Ca_2Cu_3O_x$ and $(Bi, Pb)_2Sr_2Ca_2Cu_3O_x$ compounds; the $Tl_2Ca_{1.5}BaCu_2O_x$ or $Tl_2Ca_2Ba_2Cu_3O_x$ compounds and compounds involving substitution such as the $Nd_{1+x}Ba_{2-x}Cu_3O_x$ compounds. These copper oxide superconductors are type II superconductors.

Several researchers have focussed on introducing controlled defects into the HTS materials to increase the pinning forces. These defects reduce the movement of the fluxoids and permit high critical currents even at relatively high temperatures and high magnetic fields. Magnetic field that penetrates the superconducting material may also lead to "trapped" magnetic field. The trapped field can be pinned in place even when there is no supporting external magnetic field. An ingot of superconducting material with trapped magnetic field, not supported by another magnet, is called a trapped field magnet, and is similar in some ways to a permanent magnet.

When the externally applied magnetic field (or the applied current) is removed, the trapped magnetic fields decay over time, which is called flux creep. Flux creep tends to stabilize the flux distribution in the superconducting material by relieving the magnetic pressure. Flux creep, which decays approximately logarithmically over time, is a measure of loss of the trapped magnetic field. The magnetic flux density is supported by the pinning force and is related to the current density by Ampere's law. As the current density is increased toward the critical current density $J_C(T)$, flux creep increases.

As mentioned above, particular defects increase pinning of the fluxoids. The optimal defect diameter is determined by two parameters of the superconducting material. The first parameter is the magnetic field penetration depth, which determines how far from the defect the magnetic field may penetrate into the superconducting material. The second parameter is the coherence length, which determines how far into the superconductor, from the defect, the vortex current builds up.

In 1989, vanDover et al. reported that $J_C$ and $H_{irr}$ improve when $YBa_2Cu_3O_7$ single-crystals are irradiated either with thermal or fast neutrons (See R. B. van Dover et al., "Critical Currents Near $10^6 A/cm^2$ in Neutron-irradiated Single-Crystal $YBa_2Cu_3O_7$", Nature, vol. 342, pp. 55–57, 1989.).

Civali et al. reported creation of columnar defects in $YBa_2Cu_3O_7$ crystals by 580-MeV Sn-ion irradiation. The columnar defects allow the field to pass through the material and also serve as pinning centers with attractive potentials that reduce the flux creep. (See Civali et al., "Vortex Confinement by Columnar Defects in $Yba_2Cu_3O_7$ Crystals: Enhanced Pinning at High Fields and Temperatures", Phys. Rev. Lett., vol. 67, p. 648, 1991).

Weinstein et al. reported increase in the critical current density of the YBCO material exposed to high-energy light-ion irradiation. (See R. Weinstein et al., "Materials, Characterization and Applications for High $T_C$ Superconducting Permanent Magnets", Applied Superconductivity, Vol.1, pg. 1145–1155, Pergammon Press, 1993).

Fleischer et al. reported some increase in $J_C$ and $H_{irr}$ in polycrystalline bulk HTS materials or films doped with a mixture of uranium-238 and uranium-235 and subsequently irradiated with thermal neutrons to cause fission. (See Fleischer et al., "Increased Flux Pinning upon Thermal-Neutron Irradiation of Uranium-doped $Yba_2Cu_3O_7$", Phys. Rev. B, Vol. 40, pp. 2163–2169, 1989; Luborsky et al., "Critical Currents after Thermal Neutron Irradiation of Uranium Doped Superconductors", J. Mater. Res., Vol. 6, pp. 28–35, 1991; Fleischer et al., "Increased Flux Pining Upon Thermal-Neutron Irradiation of Uranium-Doped $Yba_2Cu_3O_7$", Gen. Electric Tech. Report #89CRD047, April 1989; and U.S. Pat. No. 4,996,192)

Safar et al. reported improved $J_C$ and $H_{irr}$ in the HTS bismuth materials irradiated with high-energy protons (800 MeV). (See Safar et al. Appl. Phys. Lett. vol. 67, p. 130, 1995)

In general, there is a need for a high $T_c$ superconducting material with $T_c$ above 77 K and high values of $J_C$ and $H_{irr}$, which can be economically produced in uniform bulk quantities, or in form of thick or thin films, and which are suitable for different superconducting applications.

SUMMARY OF THE INVENTION

In one aspect, the invention is a textured high $T_c$ superconducting material that includes a chemical element or compound that can be fissioned. The fissionable element or compound does not spoil the texturing. The textured high $T_c$ superconducting material may be subjected to neutron irradiation to further increase $J_C$ and $H_{irr}$ of the material. The textured, irradiated superconducting material may be economically produced in uniform bulk quantities, or in form of thick or thin films, and does not have high residual radioactivity. While neutron irradiation is preferred, the texturing of the HTS material is essential.

Texturing, as defined herein, includes any process of aligning microcrystals or growing larger crystals in a bulk sample, and also includes "natural" texturing that occurs when a thick film is deposited (for example, by spin coating) or a thin film is deposited by any of the known physical deposition method (for example, sputtering, evaporation, epitaxial growth) and in processed in-situ or ex-situ. Without texturing the polycrystalline HTS has very low intergrain current density. The fissionable element or compound may be uranium-235 or an intimate mixture of uranium-235 and uranium-238, or plutonium-239, which is added to a precursor superconducting material in an additional step before texturing the material.

In another aspect, the invention offers an irradiation enhanced, textured oxide superconducting material with significantly higher $J_C$ and $H_{irr}$ than superconducting materials currently made with other techniques. Bulk samples of the textured oxide superconducting material having 2 cm in diameter and 0.8 cm in length achieve average current densities of 85,000 A/cm$^2$ and trapped magnetic fields above 20,000 Gauss. This superconductivity material in the size of a 3 mm cube achieves average current densities of 300,000 A/cm$^2$ at 2,500 Gauss at T=77 K, and achieves 10$^6$ A/cm$^2$ at 2,500 Gauss at T=50 k.

In another aspect, an oxide superconductor includes a textured superconducting material including an array of defects finely dispersed throughout the superconducting material. These defects include a compound that comprises barium, oxygen, at least one rare earth element, and at least one of the following chemical elements: uranium-238, Nd, Mn, Re, Th, Sm, V, and Ta.

Preferred embodiments of these aspects include one or more of the following features: The one rare earth element is preferably yttrium, neodymium or samarium, but may also be lanthanum, europium, gadolinium, dysprosium, hafnium, erbium, thulium, ytterbium or lutetium or their combination. The compound forms a pinning site. If the rare earth element is yttrium and the chemical element is uranium, the compound has substantially the following atomic ratio ($U_{0.4}Y_{0.6}$) $BaO_3$; alternatively, yttrium and uranium are replaced with any of the elements listed in the two groups, but such compound still has a substantially similar stoichiometry of as the uranium—yttrium compound. The compound may include platinum. If platinum is included, the rare earth element is yttrium and the chemical element is uranium, the compound has substantially the following atomic ratio ($U_{0.6}Pt_{0.4}$)$YBa_2O_6$; alternatively, yttrium and uranium are replaced with any of the elements listed in the two groups, but such compound still has a substantially similar stoichiometry as the uranium-platinum-yttrium compound.

In another aspect, an oxide superconductor includes a textured superconducting material including an array of defects with a neutron-fissionable element. The array of defects is dispersed throughout the superconducting material.

Preferred embodiments of this aspect include one or more of the following features: The defects may be predominantly between 1 nanometer and 1000 nanometers in size, but preferably the defects are between 1 and 100 nanometers. The oxide superconductor may further include a matrix of dispersed randomly oriented defects from 1 to 1000 nanometers in diameter and 0.1 to 20 micrometers in length created by fission. The defects may predominantly be individually aligned sets of broken columnar defects, bead-shaped defects or irregularly shaped defects. Such defect sets measure predominantly from 1 to 1000 nanometers in diameter and 0.1 to 20 micrometers in length, but preferably between 3 to 100 nanometers in diameter and less than 20 micrometers in length.

The oxide superconductor may include a finely dispersed matrix of fission products that are aligned with the columnar or aligned defects. The neutron-fissionable element may be provided in the amount of 0.001% to 6% of the weight of the material. The neutron-fissionable element may be uranium or plutonium. The neutron-fissionable element may be uranium-235 in the amount of 2 parts per million by weight to 4% by weight of the superconducting material.

In another aspect, an oxide superconductor includes a textured superconducting material with an array of defects including a compound of a neutron-fissionable element, wherein the array of defects is dispersed throughout the superconducting material.

In another aspect, an oxide superconductor includes a textured superconducting material with an array of defects including a compound of a neutron-fissionable element and platinum, wherein the array of defects is dispersed throughout the superconducting material.

Preferred embodiments of the above aspects include one or more of the following features: The textured superconducting material is a BiSrCaCuO superconducting material, a (Bi, Pb)SrCaCuO superconducting material, a YBaCuO superconducting material or a TlBaCaCuO superconducting material. The neutron-fissionable element is uranium and the compound further includes barium, oxygen and at least one rare earth element. The rare earth element is preferably yttrium, neodymium or samarium, but may also be lanthanum, europium, gadolinium, dysprosium, hafnium, erbium, thulium, ytterbium or lutetium or their combination.

Preferred embodiments of the above aspects may also include one or more of the following features: The oxide superconductor, wherein the neutron-fissionable element is uranium and the compound further includes barium, oxygen, and at least one rare earth element. The compound includes chemical elements with substantially the following atomic ratios $(U_{0.6}Pt_{0.4})YBa_2O_6$ or $(U_{0.4}Y_{0.6})BaO_3$. The defects formed by the compound are predominantly between 1 nanometer and 1000 nanometers in size. The compound includes uranium (or a chemical element with substitutional properties such as Nd, Sm, Mn, Re, V or Ta) in an amount of 0.01% to 6% of the weight of the material. The neutron-fissionable element is uranium-235 in an amount of 2 parts per million by weight to 4% by weight.

The oxide superconductor includes a matrix of finely dispersed randomly oriented defects created by fission. The randomly oriented defects have columnar shape with 1 to 1000 nanometers in diameter and 0.1 to 20 micrometers in length. The randomly oriented defects are finely dispersed and randomly oriented and have the form of aligned broken columns, beads and irregular shapes with 1 to 1000 nanometers in diameter and 0.1 to 20 micrometers in length. The oxide superconductor includes a finely dispersed matrix of fission products, the products spatially aligned with the columnar or broken columnar defects.

Preferred embodiments of the above aspects may also include one or more of the following features: A superconducting trapped-field magnet made of the above-described oxide superconductors capable of maintaining a persistent circulating current within the oxide superconductor material. The current density of the circulating current is in the range 100 to 10,000,000 amps per square centimeter. A magnetic shield made of the above-described oxide superconductors capable of maintaining in a superconducting state a persistent circulating current within the oxide superconductor material. The current density of the circulating current is in the range 100 to 10,000,000 amps per square centimeter. A superconducting wire made of the above-described oxide superconductors. A magnetic levitator made of the above-described oxide superconductors. The magnetic exhibits in a superconducting state the current density in the range 100 to 10,000,000 amps per square centimeter.

In another aspect, an oxide superconductor is made by a method including the steps of: providing a precursor superconducting material; providing a neutron-fissionable element; combining the precursor superconducting material with the neutron-fissionable element; and texturing the precursor superconducting material combined with the neutron-fissionable element to form a textured superconducting material including an array of defects with a neutron-fissionable element, the array of defects being dispersed throughout the superconducting material.

In another aspect, an oxide superconductor is made by a method including the steps of: providing a precursor superconducting material; providing at least one of the following chemical elements: uranium-238, Nd, Mn, Re, Th, Sm, V, and Ta; combining the precursor superconducting material with at least one of the chemical elements; and texturing the precursor superconducting material combined with the chemical element to form a textured superconducting material including an array of defects with the chemical element, the array of defects being dispersed throughout said superconducting material.

Preferred embodiments of the above aspects include one or more of the following features: The oxide superconductor is one of the following: a BiSrCaCuO superconducting material, a (Bi, Pb)SrCaCuO superconducting material, a YBaCuO superconducting material, and a TlBaCaCuO superconducting material. The precursor superconducting material is a stoichiometric mixture or a non-stoichiometric mixture of chemical elements of an oxide superconductor. The chemical element is included in a compound, and the non-stoichiometric mixture includes a selected deviation from a stoichiometry of the oxide superconductor, the deviation being selected with respect to stoichiometry of the compound including the neutron-fissionable element, or another compound suitable for formation of pinning sites. The neutron-fissionable element is included in a compound, and the non-stoichiometric mixture includes a selected deviation from a stoichiometry of the oxide superconductor, the deviation being selected with respect to stoichiometry of the compound including the amount of the neutron-fissionable element and any other chemical element substituted for the neutron-fissionable element. The neutron-fissionable element substitutionally replaces one or more elements of the above superconducting materials.

Preferred embodiments of the above aspects may also include one or more of the following features: The neutron-fissionable element is in form of a powdered oxide and the combining step of the method includes mixing the powdered oxide with the precursor superconducting material. The neutron-fissionable element in an amount of 0.01% to 6% by weight of the final material. The neutron-fissionable element includes uranium-235 in an amount between 2 parts per million and 4% of the oxide superconductor by weight. The step of providing the neutron-fissionable element includes: producing a solution of the neutron-fissionable element by dissolving the element in an acid; neutralizing the acid; and precipitating the neutron-fissionable element from the solution as an oxide. The acid includes nitric acid. The acid is neutralized with ammonium hydroxide. The method further includes the step of irradiating with neutrons the textured precursor superconducting material combined with the neutron-fissionable element. The irradiating step includes exposing the textured precursor superconducting material combined with the neutron-fissionable element to the total neutron fluence between $10^{14}$ and $10^{19}$ neutrons per square centimeter.

DETAILED DESCRIPTION

In one preferred embodiment, a pure powder of $YBa_2Cu_{3}7_{-\delta}$ (Y123), plus 60% molar increase in Y was produced by providing $Y_2BaCuO_5$ (available commercially), 0.5% Pt by weight, and 0.3% $UO_4$ by weight. These chemicals are mixed, and then ball milled for 24 hours. Cylindrical forms about 1 inch in diameter are filled with the powder and compacted by a uniaxial press, using a force of 5000 lbs. The mass of a sample compacted in this way is about 25 grams. A top seed of $SmBa_2Cu_3O_{7-\delta}$ (Sm123) was placed in the center of the top of the sample and the sample was placed in a programmable oven. The temperature was first increased to 925° C. and held there for 4.5 hours, in order to sinter the sample. Then the temperature was increased to 1025° C. to melt the powders, and hold them at this temperature for 1 hour. To slowly cool the sample, the temperature was then decreased at 1° C. per hour for 120 hours and then cooled to room temperature at 4° C. per hour. These sample were later characterized as is summarized in FIGS. 5 through 7.

To obtain the original intimate mixture of uranium-238 and enriched uranium-235 both isotopes of uranium were dissolved together in an acid solution and re-precipitated as an ultra-fine powder of uranium oxide ($UO_4$) UOis a desirable form for the precipitated uranium, but other forms of the precipitate may also used. The ratio of uranium-238 to uranium-235 in the precipitate is controlled by the ratio of these two isotopes in the original solution. The goal is to produce extremely fine powdered $UO_4$ dispersed throughout the "Y123" material.

During the slow cooling, clusters of microcrystals formed small grains. Some clusters of microcrystals grew to sizes of 1×1×0.3 cm³ without using the Sm seed. The uranium-YBCO grains were composed of many micro-crystals with parallel (a, b) planes. Upon the above melt texturing process, the uranium-YBCO material forms a stable compound.

Alternatively, the powders containing the HTS chemicals may be pressure textured as described by Jamny et al. "Processing and Properties of Ag Clad BiSSCO Superconductors", Proceedings of the 10th Anniversary HTS workshop, Houston, Tex., Ed. B. Batlog et al., World Scientific Press (1996).

By using a seed crystal, which has a higher melting temperature, the entire melt grows into substantially a single grain and can reach sizes 10×10×5 cm³. A Sm123 seed crystal may be used. The advantage of a seed is that the grain-planes will grow parallel to the seed crystal planes, and can be controlled using the seed. The seed also allows the desired grain to grow at a higher temperature than it normally would and to grow into a sizable crystal before many small crystals are formed by multi-nucleation.

Figure 1A:
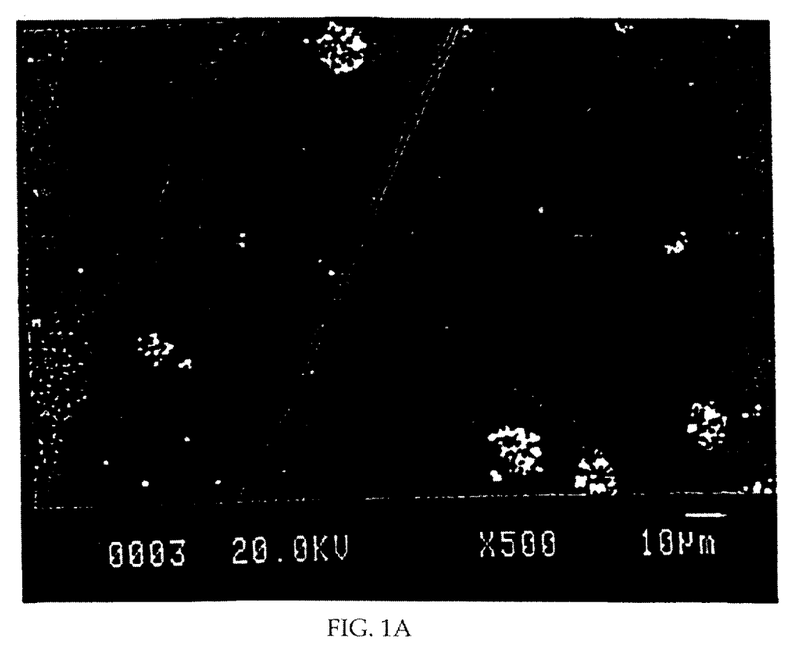
FIGS. 1A and 1B are SEM photomicrographs of a uranium-YBCO superconducting material.
Figure 1B:
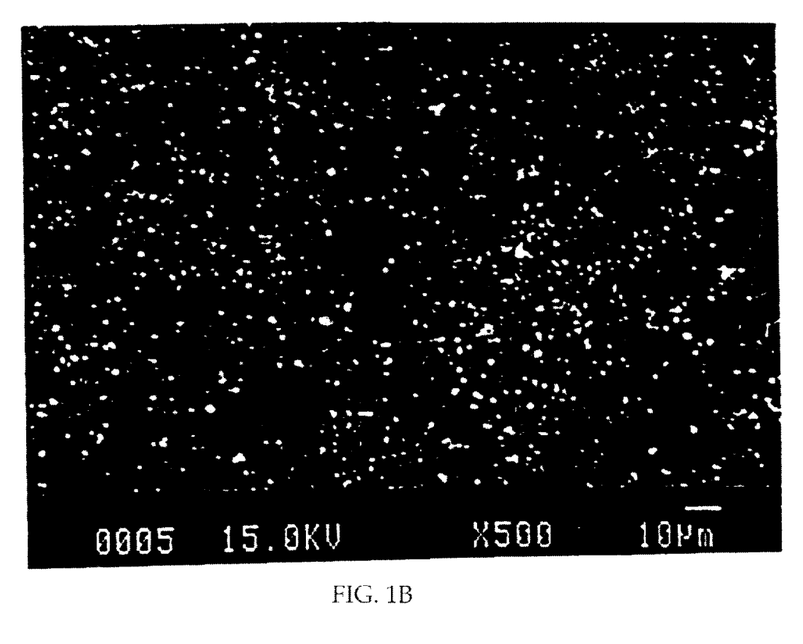

After texturing, the uranium HTS superconducting material exhibited an increase in the critical current density $J_C$, prior to final irradiation, due to addition of uranium. The uranium forms a new, very finely dispersed compound with yttrium, barium and oxygen compound of about 300 nanometers in size dispersed within the YBCO matrix. The atomic proportions of yttrium, uranium, barium and oxygen in the compound are close to $(U_{0.4}Y_{0.6})BaO_3$. FIGS. 1A and 1B are SEM micrographs of the uranium-YBCO finished material, wherein the white spots are grains of the uranium-yftrium-barium-oxygen compound. The black background is the YBCO material. FIG. 1A shows clustering the uranium compound deposits while FIG. 1B shows the uranium compound more dispersed by ball milling the powder.

The addition of platinum (for example, 0.5% platinum by weight) forms a different compound than uranium-YBCO. This compound forms, at the defect sites, a phase of the compound $(U_{0.6}Pt_{0.4})$ $YBa_2O_6$. Furthermore, platinum also reduces the size of a secondary, non-superconducting, phase (i.e., $Y_2BaCuO_5$, called Y211) within the Y123 material and promotes better texturing of the Y123 material.

Figure 2:
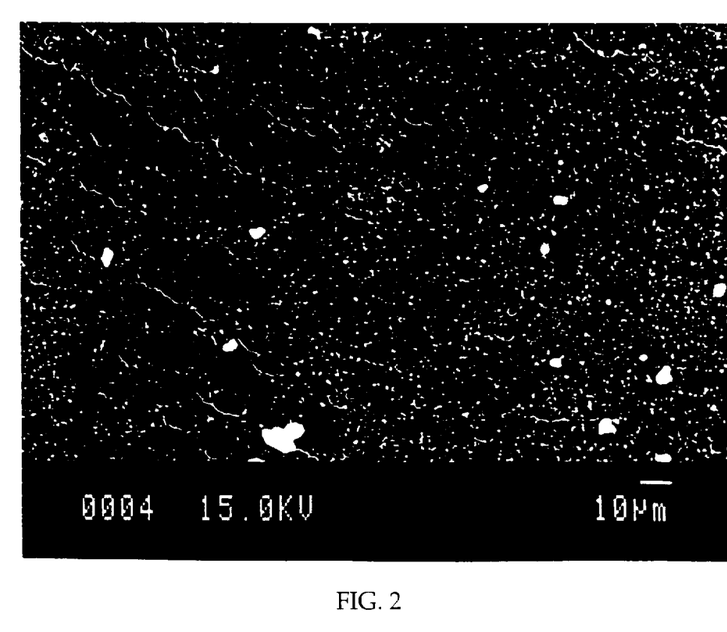
FIG. 2 is an SEM photomicrograph of a platinum-uranium-YBCO superconducting material.
Figure 3:
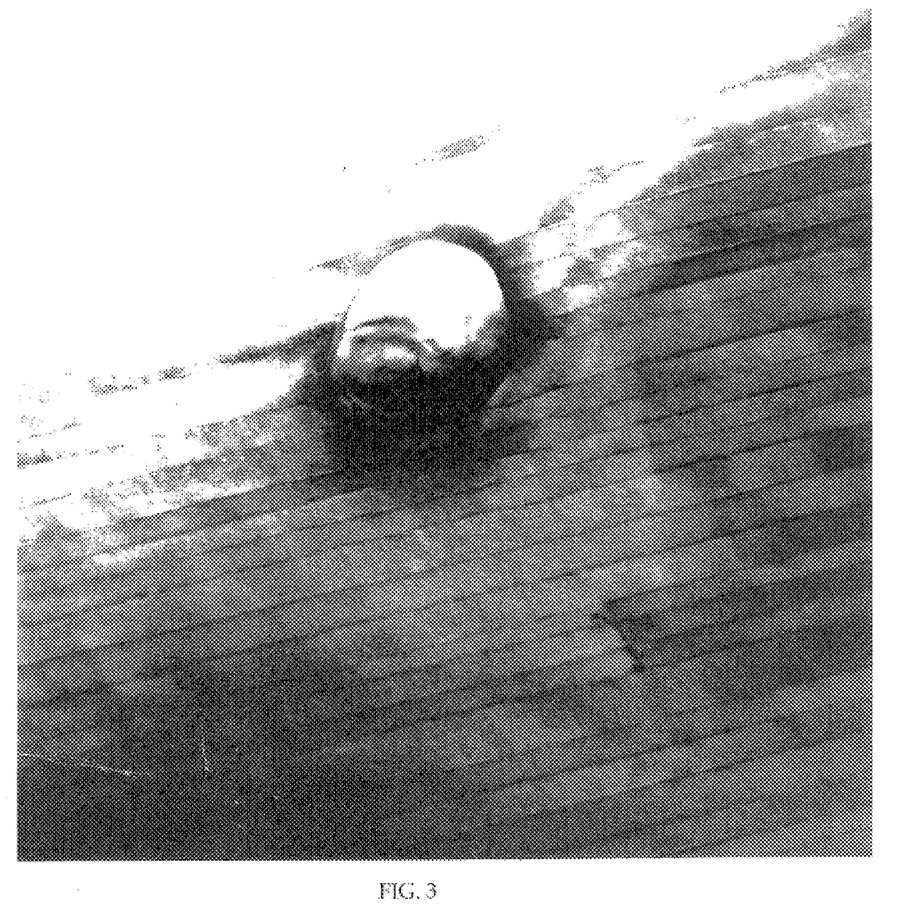
FIG. 3 is an TEM micrograph of a platinum-uranium-YBCO superconducting material showing a typical deposit of the compound.

FIG. 2 is an SEM micrograph of the platinum-uranium-YBCO compound. The small white dots are formed by the uranium-platinum-yttrium-barium-oxygen compound. The black background is the YBCO material. The large white areas are a compound of platinum not containing uranium (i.e., $PtBa_4Cu_2O_7$). FIG. 3 is a TEM micrograph of a typical deposit of the U-Pt-Y-Ba-O compound (i.e., $(U_{0.6}Pt_{0.4})YBa_2O_6$ in Y123), which is approximately 300 nm in size.

Figure 4:
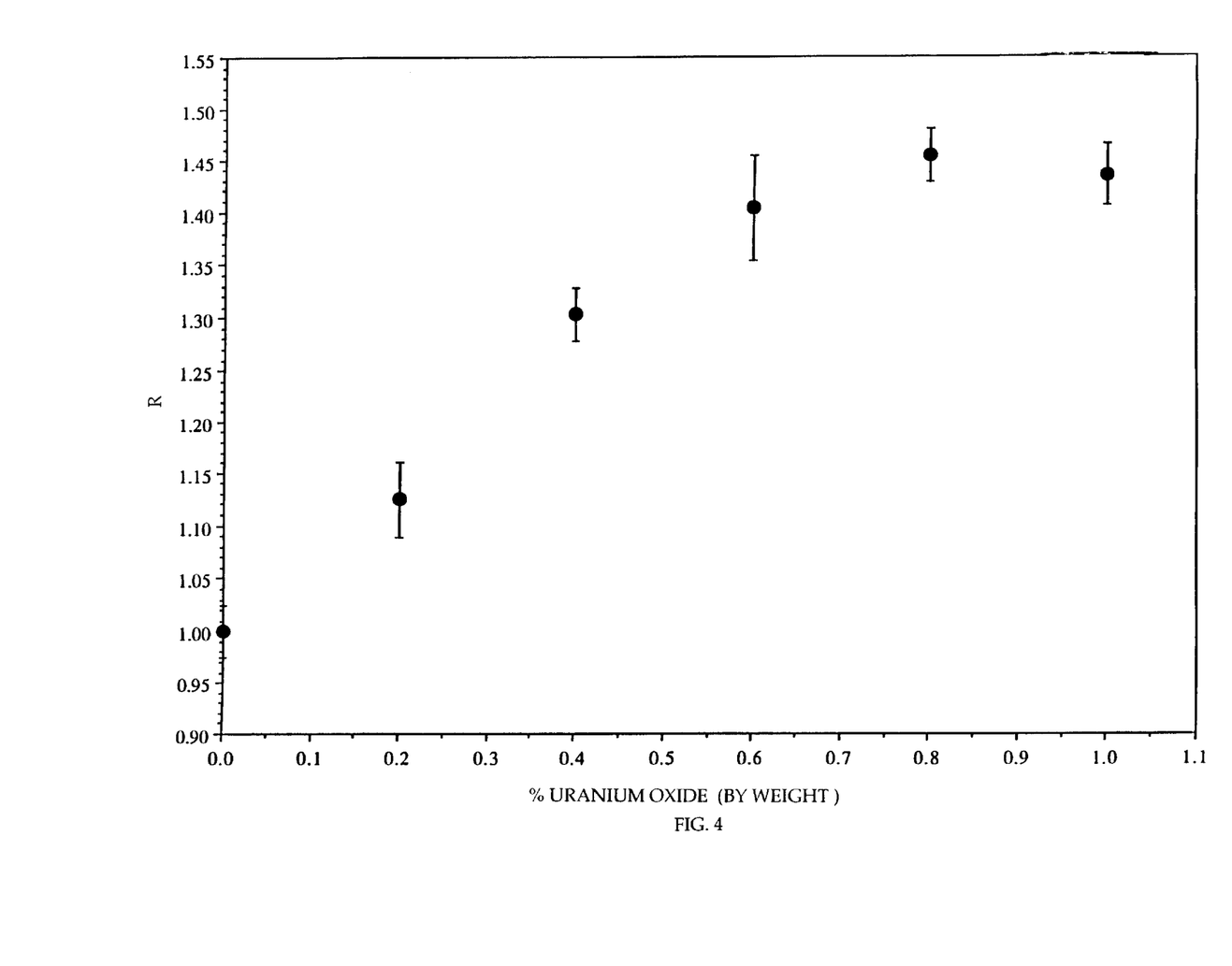
FIG. 4 depicts graphically the critical current density as a function of the uranium content.

FIG. 4 summarizes the effect of adding uranium on the critical current density prior to neutron irradiation. The critical current density increases with the uranium content by weight (in the presence of 0.5% platinum by weight), wherein R is the ratio of $J_C$ for samples with uranium to $J_C$ of samples without uranium. The chemical benefits of the addition of uranium on improving $J_C$ have been found to be independent of the isotope of uranium used, but depending somewhat on the presence of platinum in the original HTS material mixture. If no platinum is present, a few tenths of a percent of uranium by weight are sufficient to observe the beneficial chemical effects of uranium. Deterioration in the quality of the textured HTS material is observed when the quantity of uranium added exceeds 3.0% by weight without the presence of platinum in the material.

Some of the benefits of the present invention depend only on the presence of small quantities of chemical uranium (independent of isotope) in the mixture, while other benefits are sensitive to the amount of uranium-235 present, and are manifest primarily after irradiation, which causes a fission reaction primarily in the uranium-235. All these compounds exhibit long-term stability within the YBCO matrix.

In another preferred embodiment, the stable compound of uranium is formed externally rather than as the integral part of the melting process described above. In this process, the uranium compound, e.g., $(U_{0.6}Pt_{0.4})YBa_2O_6$, is powdered and the powder is added to an HTS mixture prepared by any of the standard techniques known in the art. Then, the combined powders are textured. In another preferred embodiment, recently several samples were prepared by the above process, but the amount of uranium was reduced to 0.15% by weight from 0.3% by weight. These samples exhibited an increase in the resulting trapped field by about 20%, which should increase $J_C$ by more than 20%. It is expected that reducing $UO_4$ by a factor of 2 will increases $J_C$ by 20%.

In another preferred embodiment, the uranium-YBCO superconducting material and the platinum-uranium-YBCO superconducting material was placed in a nuclear reactor and irradiated by thermal (low energy) neutrons. The preferred total neutron fluence (i.e., the number of neutrons per square centimeter over the entire irradiation) is from about $2 \times 10^{16}$ n/cm² to about $12 \times 10^{16}$ n/cm² and more preferably about $5 \times 10^{16}$ n/cm². The neutron irradiated U235 undergoes fission producing fission fragments and energy (U235+n thermal→fission fragments+energy). The energy release in this reaction varies between 160–200 million electron-volts (MeV), and the combined range of the (nearly) back-to-back fission fragments is approximately 16 micrometers. The fission fragments have energy of about 100 MeV each and a spectrum of possible nuclear charges (Z), about equal to that of silver (See, for example, R. Weinstein, *Nuclear Engineering Fundamentals—Book II: Nuclear Physics*, page 97, 1964, McGraw-Hill Book Co.). The 200 MeV fission fragments create columnar defects, which are excellent pinning centers. The number of the pinning centers created by fission fragments in the irradiated HTS material per unit area depends upon the amount of U235 added and upon the neutron fluence per square centimeter. The penetration depth obtainable with neutrons allows the processing of uniform samples of much greater thickness (on the order of 20 centimeters thick in some materials) than is possible with high-Z irradiation In the bulk HTS material, samples 2 cm in diameter and 0.8 cm long average current densities of 85,000 A/cm$^2$ have been obtained using the present invention. Trapped magnetic fields in samples of this size have been measured above 20,000 Gauss. In a 3 mm×3 mm sample, average current densities of 290,000 A/cm$^2$ were measured.

The residual radioactivity of the resulting HTS material is very low. The residual radioactivity resulting in emission of gamma rays 10 months after irradiation was below 1 microcurie for a 15 gram sample (i.e., below 60 nanocuries per gram). The residual radioactivity can be further reduced, by increasing the amount of U235 used in the uranium mixture. The present invention can use naturally occurring uranium, or the natural ratio of uranium-235 to uranium-238 be reduced by using so-called depleted uranium, or increased by using so called enriched uranium. Furthermore, using the enriched uranium (i.e., increasing the ratio of uranium-235 to uranium-238 as described above) results in an improved critical current density and radioactivity when using the above-provided neutron fluences. The residual radioactivity comes almost equally from two sources. First, the fission fragments remain radioactive. Second, during irradiation, the neutrons interact also with the other constituent atoms (i.e., Y, Ba, Cu, Pt and O), which accounts for approximately half of the radioactivity. By increasing the amount of U235 in a sample one can lower the neutron fluence to achieve the result. A lower neutron fluence causes fewer interactions with Y, Ba, Cu, Pt and O. Therefore, by increasing the relative amount of uranium-235 the radioactivity due to Y, Ba, Cu, Pt and O will decrease, while the radioactivity due to fission of U stays constant (i.e., more U235 is used to balance the lower neutron fluence). In summary, when the samples are irradiated, some of the U235 component fissions. The fission fragments cause quasi-collumnar damage which improves the HTS.

In another preferred embodiment, uranium-235 can be replaced by another fissionable nuclide that is long lived such as $_{94}$Pn$^{239}$ (plutonium-239). Another consideration is the price of the fissionable element. Uranium-235 occurs naturally and can be purchased for less than $500 per gram, while plutonium-239 is produced in a reactor. Other nuclides, such as some of the transuranic elements (for example curium-248, which has 348,000yr life time) can also be used, but their production cost can make it impractical for use in an application.

In general, the neutron fissionable element may be used together with any HTS material from the following three groups of compounds: (i) Y-123 phases $RE_1Ba_2Cu_3O_{7-\delta}$ with RE=Y, Nd, La, Sm, Eu, Gd, Dy, Ho, Er, Tm, Yb, Lu; (ii) $Bi_2Sr_2CaCu_2O_x$, $(Bi, Pb)_2Sr_2CaCu_2O_x$, $Bi_2Sr_2Ca_2Cu_3O_x$ or $(Bi, Pb)_2Sr_2Ca_2Cu_3O_x$ compound (BiSCCO or (BiPb) SCCO); (iii) $Tl_2Ca_{1.5}BaCu_2O_x$ or $Tl_2Ca_2Ba_2Cu_3O_x$ compound (TIBCCO) or (iv) materials using substitution such as $Nd_{1+x}Ba_{2-x}Cu_3O_{7-\delta}$. These compounds may be prepared using the standard methods known in the art prior to adding the fissionable element and texturing. Specifically, the uranium-YBCO material can be produced by forming first the $(U_{0.4}Y_{0.6})BaO_3$ or $(U_{0.6}Pt_{0.4})YBa_2O_6$ compounds. One of these compounds is then added to YBCO (or other HTS material) before texturing. This method may be a preferred embodiment to improve the textured NdBaCuO, SmBaCuO, or BiSCCO superconductors. The tolerance of the HTS material to $UO_4$, or one of the uranium compounds, varies with the HTS material chosen. Thus while Y123 can be made with, e.g., 0.8% U by weight, Nd123 is best made with lower U addition (e.g., 0.15% U by weight).

Figure 5:
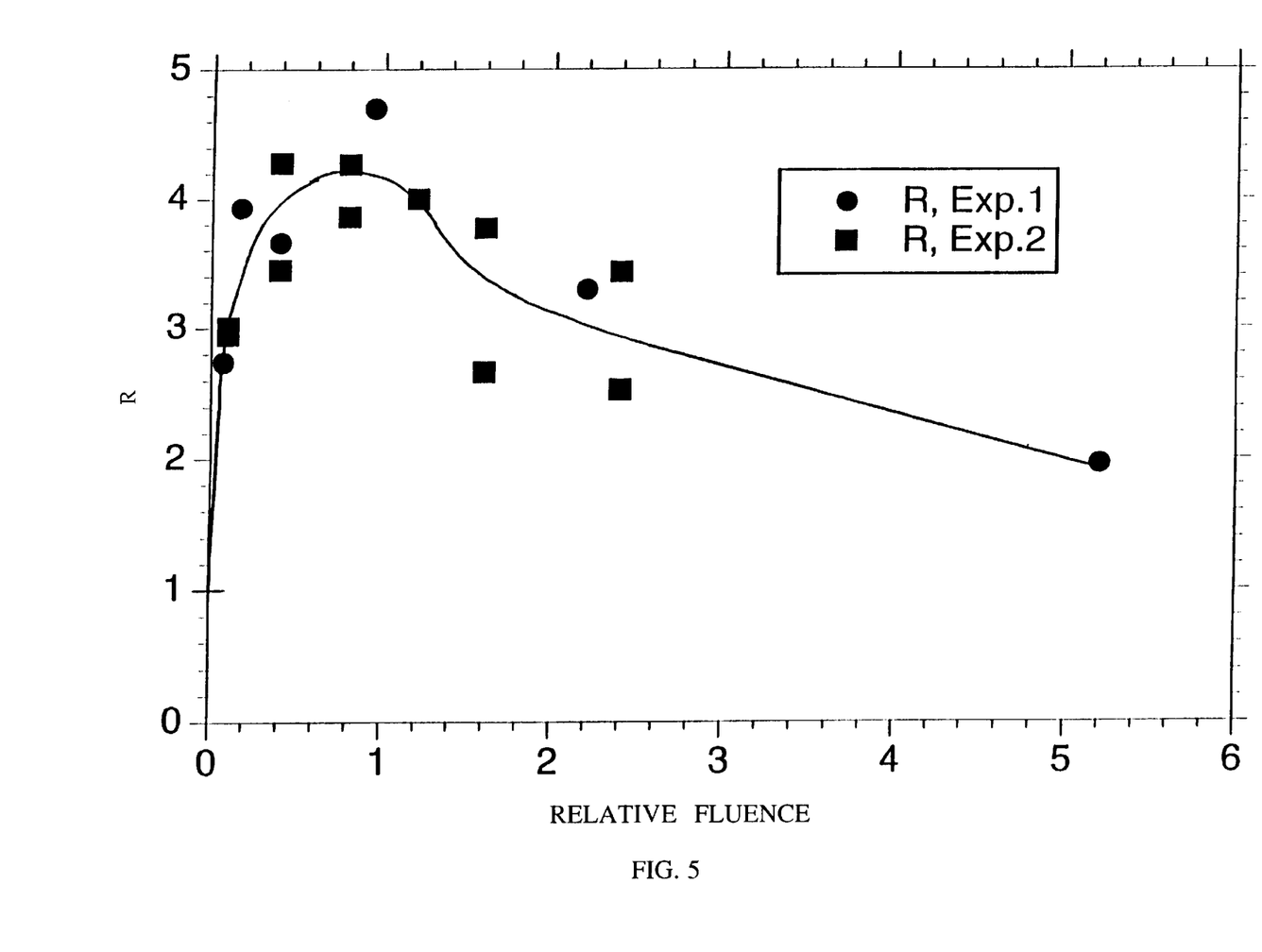
FIG. 5 depicts graphically the critical current density as a function of the neutron fluence.

FIGS. 5 through 8 summarize different measurements performed to characterize the samples that used 0.3% uranium by weight, (the $UO_4$ mixture included 6.7% of U235 as described above). FIG. 5 shows the dependence of trapped field ($B_t$) on the total neutron fluence in samples prepared by the above-described process. The trapped field is expressed in terms of a ratio $R_1$ which is $B_t$ after irradiation to $B_t$ before irradiation. As shown in FIG. 5, the neutron irradiation increased $B_t$ of the material by more than a factor of four in addition to the increase in $B_t$ by about a factor of 1.24 due to the presence of uranium in the textured YBCO superconductor. Thus, the combination of the chemical and irradiation dependent effects increased the trapped field by about a factor of 5.2. This increase corresponds to an increase of $J_C$ by about a factor of 15, if the field were held constant.

The critical current density may be further increased. For example, after irradiation the current may be increased by a factor of 4.2 while being subjected to the self field of the sample (about 2.1 T). The unirradiated sample typically has a self field of 0.4 T. Thus the increase in $J_C$, by 4.2, occurs despite the increase in field by 1.7 T. Correcting for this field effect of the increase in $J_C$, at constant field, is about a factor of 10–20.

Figure 6:
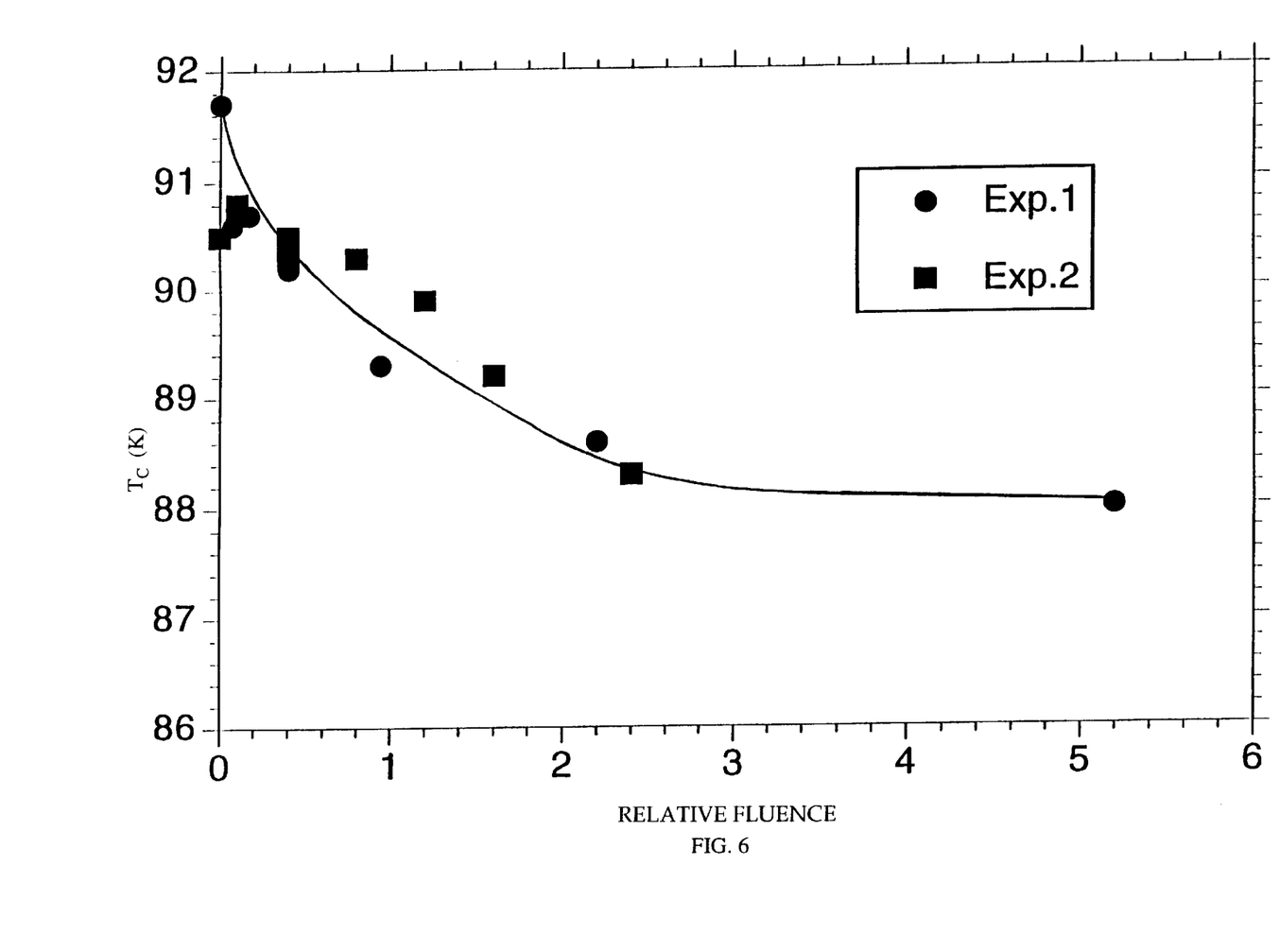
FIG. 6 depicts graphically the superconducting transition temperature as a function of the neutron fluence.
Figure 7:
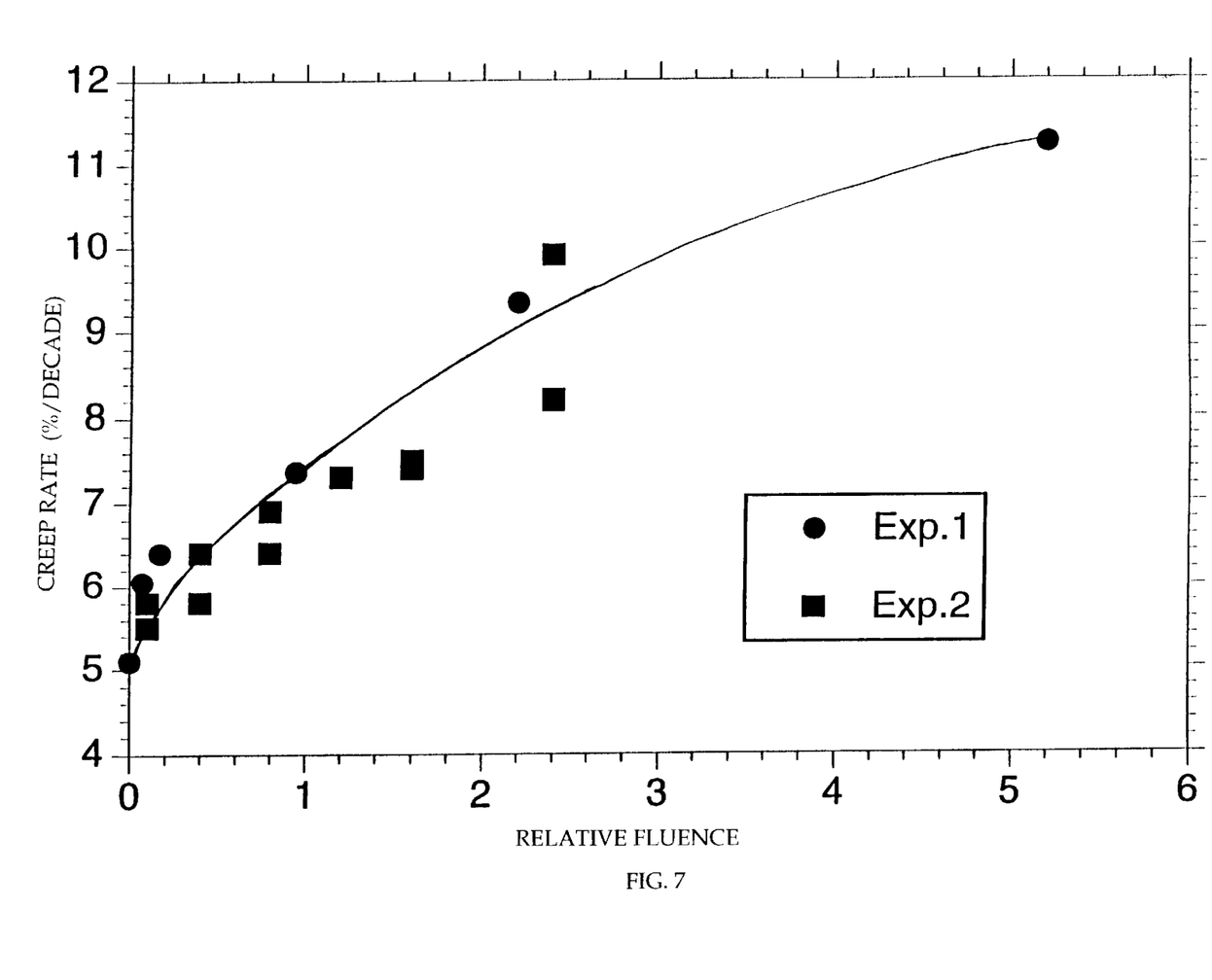
FIG. 7 depicts graphically the flux creep rate as a function of the neutron fluence.
Figure 8:
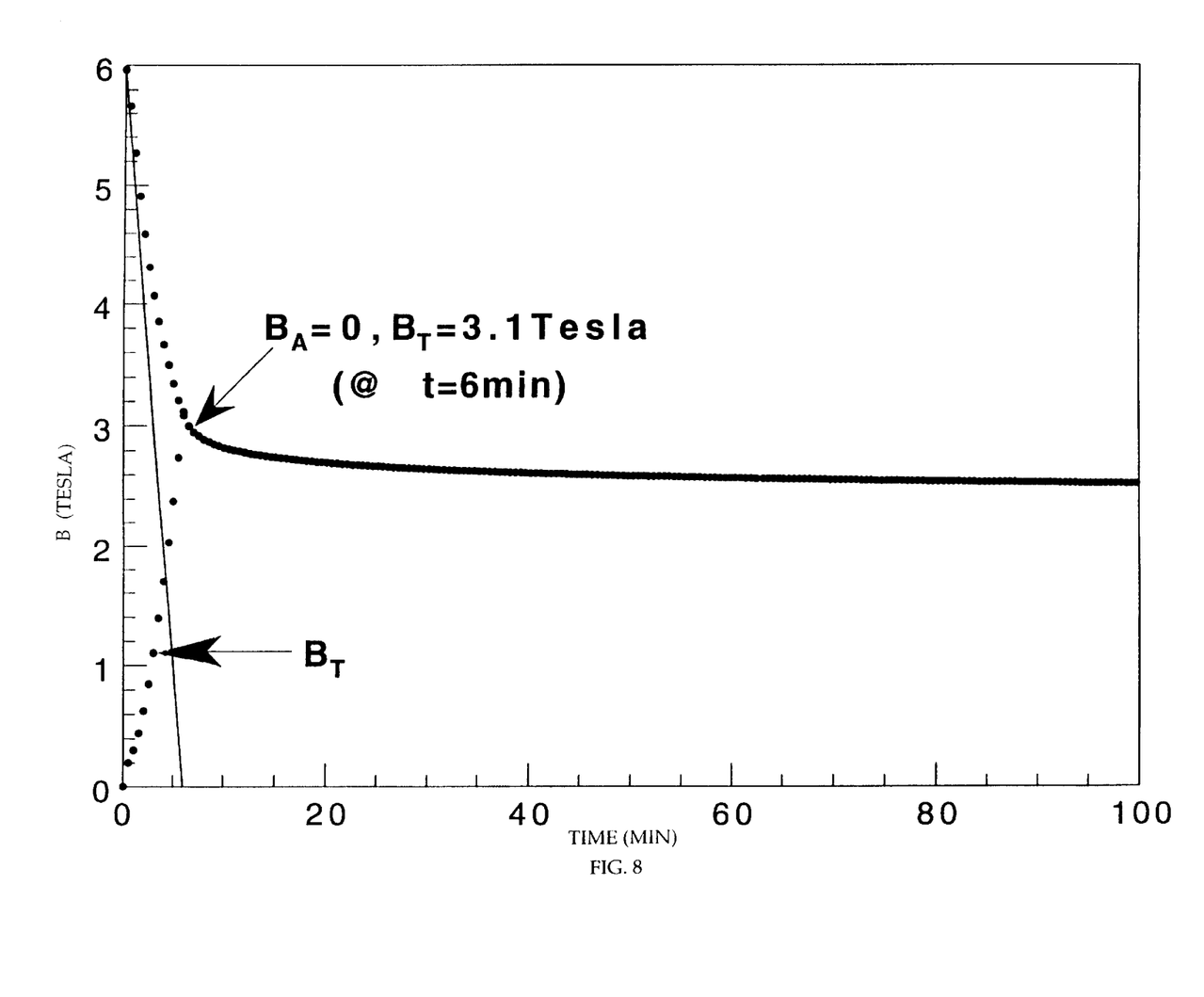
FIG. 8 depicts graphically the trapped magnetic field during "field cooling".

FIG. 6 depicts the effect of the neutron fluence on the critical temperature in sample set A. FIG. 6 provides the functional dependence of the critical temperature ($T_C$) on the relative fluence expressed in units of $10^{16}$ neutrons/cm$^2$. The critical temperature decreases about 1 K upon receiving a relatively low dose, of $2\times10^{16}$ neutrons/ cm$^2$. FIG. 7 summarizes the dependence of the flux creep on the relative fluence (in units of $10^{16}$ neutrons/ cm$^2$) measured for sample set A. The flux creep increases modestly with the relative fluence. FIG. 8 shows the trapped magnetic field obtained during the field cooling process on an assembly of four samples (sample set A) in form of an ingot. As shown in FIG. 8, the measurement yielded an exceptionally high value of trapped field of about 31,000 Gauss at 77 K. These measurements demonstrate excellent superconducting properties of the bulk material, which can be used for various applications including production of higher-field trapped-field permanent magnets.

Figure 9:
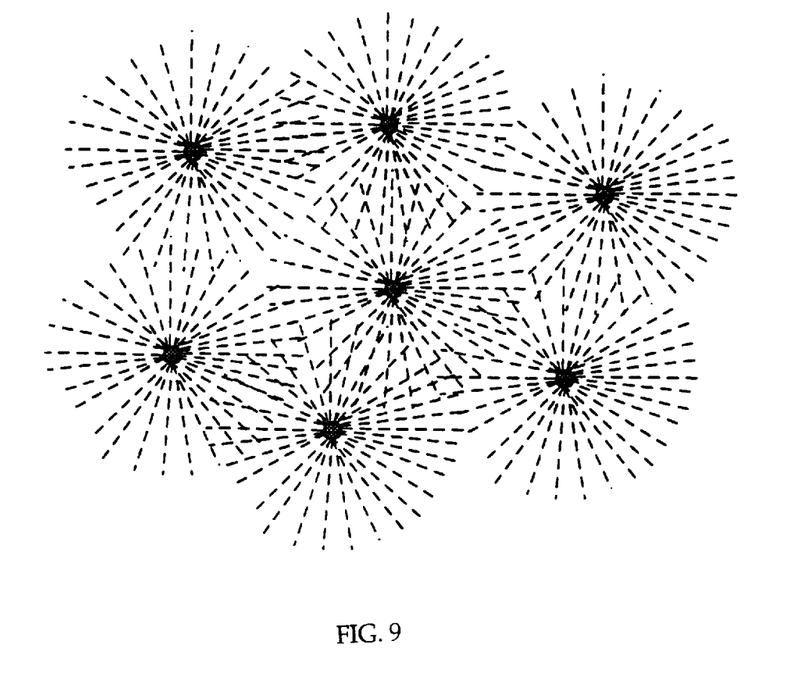
FIG. 9 depicts the spacing of uranium deposits within the superconducting material in relation to the range of the fission products produced by neutron irradiation.
Figure 10:
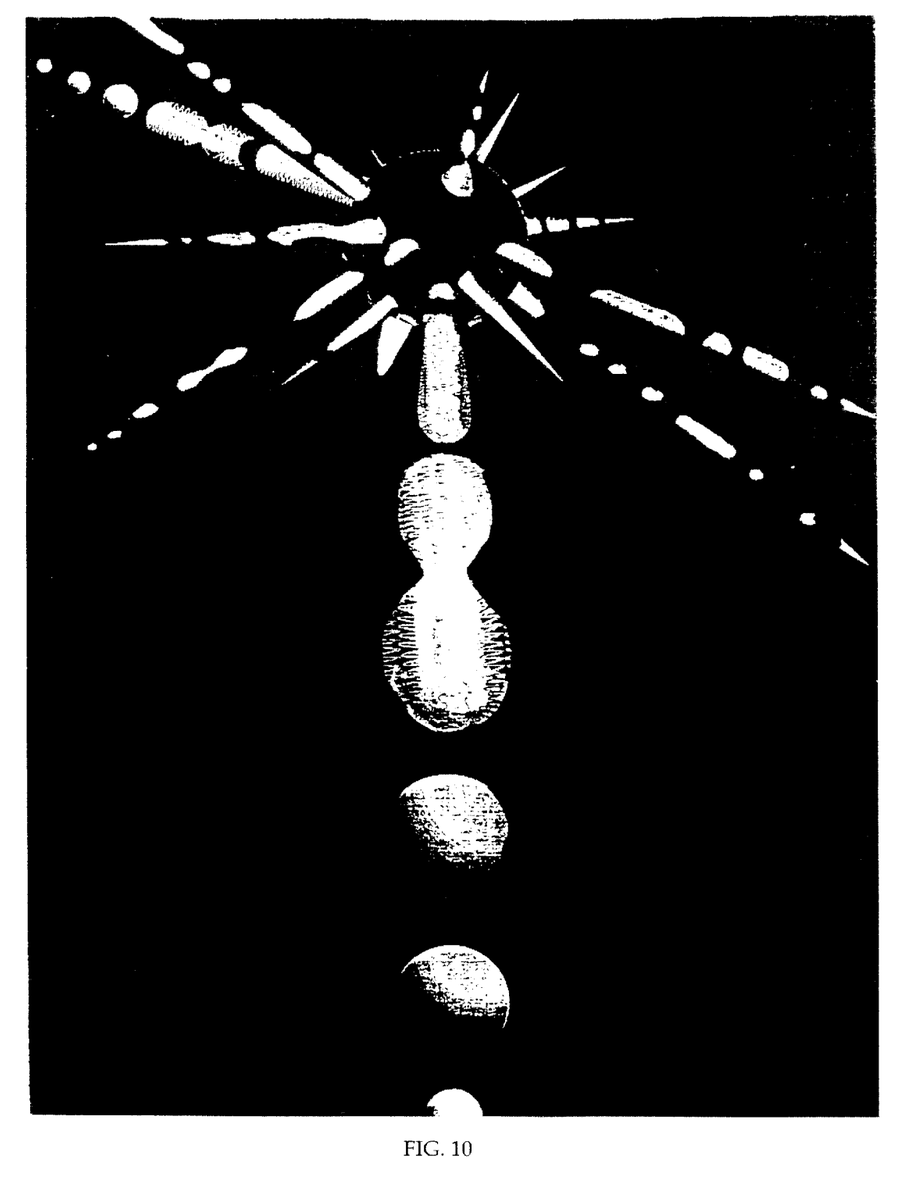
FIG. 10 depicts broken columns and beads of damage formed along the tracks of fission fragments.
Figure 10A:
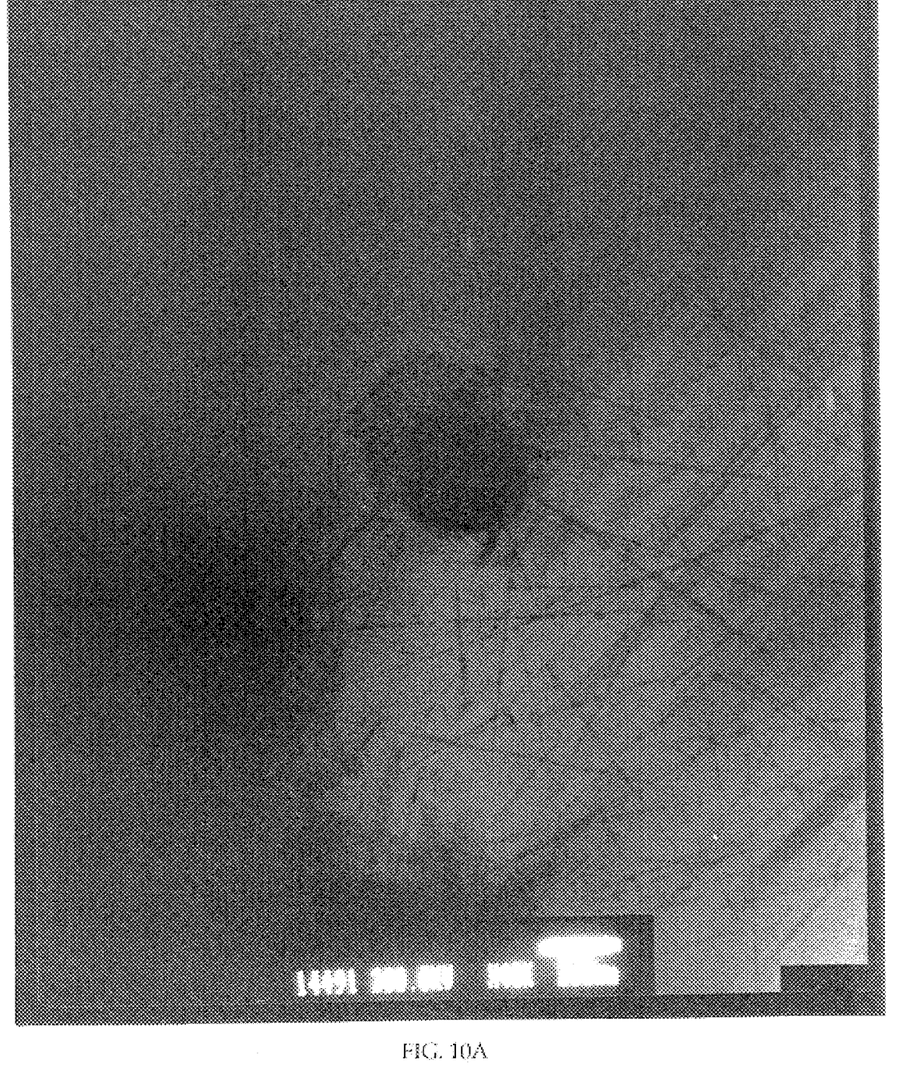
FIG. 10A is a TEM micrograph of pinning centers produced by fission.

FIG. 9 depicts the spacing of the uranium deposits within the material, in relation to the range of the fission products produced by neutron irradiation. The mean separation of the uranium deposits should be less than twice the length of a typical defect caused by a fission fragment. The mean separation can be reduced, for example, to less than one tenth of this value by adding more uranium, either directly, or by adding the above-mentioned uranium compounds to the HTS chemical powders. The nuclear fission fragments create various damage sites such as a column, a broken column, beads and aligned combinations of these formations. FIG. 10 depicts broken columns and beads of damage formed along the tracks of fission fragments. (The diameter of the columns shown in FIG. 10 should be reduced about five times to achieve the same scale as the spherical uranium deposits.) The length of the damage formations is shorter than the range of the fission fragments. FIG. 10A is a photograph taken by TEM, which shows columns, broken columns and string of bead defects caused by fission fragments. The dark spot at center is a deposit of $(U_{0.6}Pt_{0.4})YBa_2O_6$, of about 250 nm in diameter. Fission fragment damage lines originate from this compound, or originate from imbedded and unseen U deposits. The latter damage columns are seen in FIG. 10A as they traverse the field of view. The length of the damage formations is shorter than the range of the fission fragments.

In another embodiment, a thick film YBCO based superconductor is prepared as follows: A $Ba_2YCu_3O_{7-x}$ film is deposited on a substrate (for example, a polished (001) or (100) and preferably (100) $SrTiO_3$ substrate) from an organic solution containing metal trifluoroacetates prepared from powders of $BaCO_3$, $YCO_3$-$3H_2O$ and $Cu(OH)_2CO_3$ are combined in a 2:1:3 ratio, and a uranium oxide powder. These powders are reacted with between 20–30% (5.5–6.0M) excess trifluoroacetic acid in methyl alcohol followed by refluxing for approximately four hours to produce a solution substantially 0.94M based on copper content. This precursor solution is applied to the substrate with a photoresist spinner operating at a speed in the range of approximately 3000–5000 rpm for a 0.25"×0.25" substrate. Spin coating parameters can be adjusted to accommodate substrates of different types and varying dimensions. The thickness of the coatings is adjusted to obtain the final superconducting film thicker than 200 nm, preferably thicker than 300 nm and more preferably thicker than 500 nm. The precursor. coating is heated slowly at a rate approximately in the range of 0.5° to 1.0° C./min in moist oxygen having a dew point approximately in the range of 20° C. to 75° C. to a temperature approximately in the range 300°–500° C. After this heating step is complete, the coating is heated again for approximately one hour in a moist reducing nitrogen-oxygen gas mixture having a composition approximately in the range of 0.5 to 5.0% oxygen at a temperature less than 810° C. Following this heat treatment, the coating is cooled from the specified temperature range in dry oxygen for approximately 8 or more hours at a temperature in the range 400° C. to 500° C. This method is described in detail in U.S. Pat. No. 5,231,074, which is incorporated by reference. Alternatively, a uranium doped HTSC film is prepared by other methods described in this patent.

In other embodiments, the HTS materials, and films, wires and coils made of the HTS materials, are prepared by fabrication methods described in U.S. Pat. Nos. 5,683,969; 5,661,114; 5,659,277; 5,635,456; 5,604,473; 5,581,220; 5,531,015; 5,525,583; 5,472,527; 5,455,223; 5,321,003; 5,116,810; 5,034,373; 5,670,459; 5,696,057; 5,705,457; 5,541,154; 5,660;541; 5,665,682; 5,646,097; 5,652,199. All these fabrication methods are incorporated by reference as if fully included herein. The fissionable element may be included at various stages of the HTS material fabrication to disperse the element or its compound into a matrix formed by the HTS material. The entire HTS material may be irradiated prior to or after formation of a product.

The above-described methods are applicable to production of the high $T_c$ superconducting materials in a bulk form, or in a thin or thick film forms. The superconducting films may be fabricated on substrates suitable for lattice matching and on substrates with buffer layers to improve the superconducting properties of the films by improving the texturing and preventing formation of unwanted interface compounds or substrate influence. (See, for example, U.S. Pat. No. 5,602,080)

The bulk material may be used for production of wires or ingots with high values $J_c$, $H_{c1}$, $H_{c2}$. The superconducting bulk materials may be used in numerous applications including transmission lines, high field magnets for motors, generators, particle separators or accelerators, energy efficient large area dipole magnets for industrial or laboratory use, bearings, or even for levitation for trains, magnetic bumpers and other. The superconducting thick films may be used for resonator cavities, superconducting shields and other. The superconducting thin films may be used for dc or rf SQUIDs or other SQUID based instruments, Josephson switching devices, logic gates, memory cells, analog-to-digital converters, Josephson arrays as high frequency sources, quasiparticle mixers and detectors, hybrid superconductor-semiconductor devices, nonequilibrium superconducting devices, or other three-terminal devices.

The HTS materials described above can be sufficiently cooled for different commercial applications by liquid nitrogen ($T \cong 77K$), liquid air ($T \cong 80K$) or cryorefrigerators. Furthermore, the HTS materials are suitable for space applications.

The foregoing discussion should be understood as illustrative and should not be considered to be limiting in any sense. While this invention has been particularly shown and described with references to preferred embodiments thereof, it will be understood by those skilled in the art that various changes in form and details may be made therein without departing from the spirit and scope of the invention as defined by the claims.

Additional embodiments are within the following claims:

What is claimed is:

1. A method for producing an oxide superconductor comprising the steps of:
   providing a precursor superconducting material;
   providing a neutron-fissionable element;
   combining said precursor superconducting material with said neutron-fissionable element; and
   texturing said precursor superconducting material combined with said neutron-fissionable element to form a textured superconducting material including an array of defects with a neutron-fissionable element, said array of defects being dispersed throughout said superconducting material.

2. The method of claim 1 wherein said neutron-fissionable element is in the form of a powdered oxide and said combining step includes mixing said powdered oxide with said precursor superconducting material.

3. The method of claim 1 wherein said precursor superconducting material is a stoichiometric mixture of chemical elements of an oxide superconductor.

4. The method of claim 1 wherein said oxide superconductor is one of the following: a BiSrCaCuO superconducting material, a (Bi, Pb) SrCaCuO superconducting material, a YBaCuO supeerconducting material, and a TlBaCaCuO superconducting material.

5. The method of claim 1 wherein said precursor superconducting material is a non-stoichiometric mixture of chemical elements of an oxide superconductor.

6. The method of claim 5 wherein said neutron-fissionable element is included in a compound, and said non-stoichiometric mixture includes a selected deviation from a stoichiometry of said oxide superconductor, said deviation being selected with respect to stoichiometry of said compound including said neutron-fissionable element.

7. The method of claim 1 wherein said providing step includes producing a compound of said neutron-fissionable material, at least one rare earth element, barium, and oxygen.

8. The method of claim 7 wherein said rare earth element is yttrium.

9. The method of claim 1 wherein said providing includes producing a compound of said neutron-fissionable material, platinum, at least one rare earth element, barium, and oxygen.

10. The method of claim 9 wherein said rare earth element is yttrium.

11. The method of claim 1 further comprising the step of irradiating with neutrons said textured superconducting material combined with said neutron-fissionable element.

12. The method of claim 1 wherein said providing step includes providing said neutron-fissionable element in an amount of 0.01% to 6% by weight of the final material.

13. The method of claim 12 further comprising the step of irradiating with neutrons said textured superconducting material combined with said neutron-fissionable element.

14. The method of claim 1 wherein said neutron-fissionable element includes uranium-235 in an amount between 2 parts per million and 4% of said oxide superconductor by weight.

15. The method of claim 14 further comprising the step of irradiating with neutrons said textured superconducting material combined with said neutron-fissionable element.

16. The method of claim 11 wherein said irradiating step includes exposing said textured precursor superconducting material combined with said neutron-fissionable element to the total neutron fluence between $10^{14}$ and $10^{19}$ neutrons per square centimeter.

17. The method of claim 1 wherein said step of providing said neutron-fissionable element includes:

producing a solution of said neutron-fissionable element by dissolving said element in an acid;

neutralizing said acid; and precipitating said neutron-fissionable element from the solution as an oxide.

18. The method of claim 17 wherein said acid used comprises nitric acid.

19. The method of claim 18 wherein said acid is neutralized with ammonium hydroxide.

20. A method for producing an oxide superconductor comprising the steps of:

providing a precursor superconducting material;

providing at least one of the following elements; Uranium-238; Nd, Mn, Re, Th, Sm, V and Ta;

combining said precursor superconducting material with said chemical element; and texturing said precursor superconducting material combined with said chemical element to form a textured superconducting material including an array of defects being dispersed throughout said superconducting material.

* * * * *

UNITED STATES PATENT AND TRADEMARK OFFICE
CERTIFICATE OF CORRECTION

| | | |
|---|---|---|
| PATENT NO. | : 6,083,885 | Page 1 of 1 |
| APPLICATION NO. | : 09/006561 | |
| DATED | : July 4, 2000 | |
| INVENTOR(S) | : Roy Weinstein | |

It is certified that error appears in the above-identified patent and that said Letters Patent is hereby corrected as shown below:

Column 1, line 6, In the specification should include the following paragraph:

This invention was made under a contract with an agency of the U.S. Government. The name of the U.S. Government agency and Government contract number are: US Army Research Office grant #DAAH04-94-G-0310.

Signed and Sealed this
Eighth Day of July, 2014

Michelle K. Lee
*Deputy Director of the United States Patent and Trademark Office*